US010696412B2

(12) United States Patent
Mackin

(10) Patent No.: US 10,696,412 B2
(45) Date of Patent: Jun. 30, 2020

(54) COMBINED FLUID ICE PROTECTION AND ELECTRONIC COOLING SYSTEM

(71) Applicant: The Boeing Company, Chicago, IL (US)

(72) Inventor: Steve G Mackin, Bellevue, WA (US)

(73) Assignee: THE BOEING COMPANY, Chicago, IL (US)

( * ) Notice: Subject to any disclaimer, the term of this patent is extended or adjusted under 35 U.S.C. 154(b) by 279 days.

(21) Appl. No.: 15/720,938

(22) Filed: Sep. 29, 2017

(65) Prior Publication Data
US 2019/0100319 A1   Apr. 4, 2019

(51) Int. Cl.
| | |
|---|---|
| B64D 15/08 | (2006.01) |
| H05K 7/20 | (2006.01) |
| B64D 15/02 | (2006.01) |
| B64D 33/02 | (2006.01) |
| B64D 15/00 | (2006.01) |
| B64D 13/06 | (2006.01) |

(52) U.S. Cl.
CPC .............. *B64D 15/08* (2013.01); *B64D 15/02* (2013.01); *B64D 33/02* (2013.01); *H05K 7/20218* (2013.01); *B64D 15/00* (2013.01); *B64D 2013/0614* (2013.01); *B64D 2033/0233* (2013.01)

(58) Field of Classification Search
CPC ........ B64D 15/00; B64D 15/02; B64D 15/08; B64D 2013/0614; H05K 7/20218
USPC ...................................................... 244/134 C
See application file for complete search history.

(56) References Cited

U.S. PATENT DOCUMENTS

| | | | |
|---|---|---|---|
| 2,390,093 A | 12/1945 | Garrison | |
| 2,457,031 A * | 12/1948 | Campbell ............. | B64D 15/16 244/134 C |
| 3,116,395 A * | 12/1963 | Byrne .................... | B64D 15/20 219/201 |
| 3,423,052 A | 1/1969 | Lear | |
| 3,614,038 A * | 10/1971 | Nichols ................. | B64D 15/16 244/134 C |
| 4,434,201 A * | 2/1984 | Humphreys .......... | B64D 15/08 244/134 C |
| 5,944,287 A * | 8/1999 | Rodgers ................. | B64C 21/06 244/134 R |
| 6,371,411 B1 | 4/2002 | Breer et al. | |
| 6,457,676 B1 | 10/2002 | Breer et al. | |
| 6,688,558 B2 | 2/2004 | Breer et al. | |
| 8,517,601 B2 | 8/2013 | Stothers et al. | |
| 9,242,735 B1 | 1/2016 | Meis et al. | |
| 9,429,680 B2 | 8/2016 | Grzych et al. | |
| 9,469,408 B1 | 10/2016 | Elangovan et al. | |
| 9,546,004 B1 | 1/2017 | Safai et al. | |
| 9,676,485 B2 | 6/2017 | Stothers et al. | |

(Continued)

FOREIGN PATENT DOCUMENTS

WO   2009127652   10/2009

OTHER PUBLICATIONS

European Communication dated Mar. 1, 2019 for European Patent Application No. 18195596.4.

(Continued)

*Primary Examiner* — Claude J Brown
(74) *Attorney, Agent, or Firm* — Gates & Cooper LLP

(57) ABSTRACT

A method and apparatus combining an aircraft wing and engine ice protection system with an aircraft electronic cooling system.

20 Claims, 9 Drawing Sheets

(56) References Cited

U.S. PATENT DOCUMENTS

| | | | |
|---|---|---|---|
| 9,696,238 B2 | 7/2017 | Bosetti et al. | |
| 2002/0139900 A1* | 10/2002 | Porte | B64D 15/04 244/134 C |
| 2003/0150955 A1 | 8/2003 | Daggett | |
| 2005/0141422 A1* | 6/2005 | Roach | H04L 43/00 370/232 |
| 2009/0084896 A1* | 4/2009 | Boucher | B64D 13/08 244/118.5 |
| 2010/0051519 A1* | 3/2010 | Maier-Witt | C02F 1/004 210/89 |
| 2012/0048509 A1 | 3/2012 | Weber et al. | |
| 2012/0312925 A1 | 12/2012 | Asfia et al. | |
| 2013/0320145 A1* | 12/2013 | McGillis | G01F 23/284 244/134 C |
| 2014/0117106 A1 | 5/2014 | Acheson et al. | |
| 2015/0108233 A1 | 4/2015 | Wright | |
| 2015/0260099 A1 | 9/2015 | Gally et al. | |
| 2016/0311542 A1 | 10/2016 | Mackin | |
| 2016/0356180 A1 | 12/2016 | Bol | |
| 2017/0008635 A1 | 1/2017 | Mackin et al. | |
| 2017/0030266 A1 | 2/2017 | Cerny et al. | |
| 2017/0057618 A1 | 3/2017 | Khozikov et al. | |
| 2017/0158336 A1 | 6/2017 | Meis et al. | |
| 2017/0166314 A1 | 6/2017 | Meis et al. | |
| 2017/0166777 A1 | 6/2017 | Berry et al. | |
| 2017/0190431 A1 | 7/2017 | Dichek et al. | |
| 2017/0204291 A1 | 7/2017 | Berry et al. | |
| 2017/0210478 A1 | 7/2017 | Mackin | |
| 2018/0079511 A1 | 3/2018 | Mackin | |
| 2018/0079512 A1 | 3/2018 | Jackowski et al. | |

OTHER PUBLICATIONS https://en.wikipedia.org/wiki/VFW-Fokker_614, Aug. 1, 2017, 7 pages.

Extended European Search Report dated Jan. 21, 2019 for European Patent Application No. 18195596.4.

* cited by examiner

COMBINED FLUID ICE PROTECTION AND ELECTRONIC COOLING SYSTEM

BACKGROUND

1. Field

The present disclosure describes a novel ice protection and electronics cooling system.

2. Description of the Related Art

Ice buildup on aerodynamic surfaces of aircraft can be problematic. For example, ice can build up on the leading edges of wings and/or engine nacelles. The ice can also disrupt the intended airflow over the aerodynamic surfaces, causing a loss of lift generated by the aerodynamic surface. A combination of design considerations of modern airfoils and modern certification requirements result in less ice tolerance, meaning that modern aircraft need to have more anti-ice capability than some conventional anti-icing technologies can provide. However, existing anti-ice technologies are complicated and/or expensive.

Civil aviation aircraft utilize fluid ice protection systems to anti-ice wing leading edges, windshields, and propellers. Generally, aircraft with on-board anti-ice or de-ice capability use systems selected from bleed air systems, Tecalemit-Kilfrost-Sheepbridge (TKS) systems or Freezing Point Depressant (FPD) systems, pneumatic/mechanical boots, and an electric wing ice protection system (WIPS).

FIG. 1 illustrates a conventional engine bleed air de-icing system 100 on an engine inlet 102. A nozzle swirls engine bleed air 108 around the inside of the engine inlet 102 so that the heat supplied by the engine bleed air melts ice on the engine inlet 102. However, the bleed air system has a number of limitations. Firstly, the inlet structure must accommodate high internal temperatures and pressures, which are exacerbated by a variety of failure modes and dispatch considerations. This heat management requires extra wire bundles, protections and space. Secondly, the engine idle power setting must be increased when the engine anti-ice (EAI) system is operating, so that bleed flow extraction does not exceed engine capability in this condition. Thirdly, because the power setting must increase when the EAI is on, the maximum thrust available when the EAI system is operating is decreased. Finally, Specific Fuel Consumption (SFC) also increases when the EAI system is operating. Though this has only a small impact on block fuel usage for most missions, it becomes significant when the effect on engine-out conditions is analyzed as part of conformance with Extended-range Twin-engine Operational Performance Standards (ETOPS) is considered. Ultimately the SFC increase due to EAI increases the required fuel reserve and impacts take-off weight for every mission. For Ultra High Bypass (UHB) engines with large fan diameters and smaller cores, these issues are magnified. In fact, the reduction in maximum thrust available due to the EAI system may ultimately impact UHB engine core size and result in weight and SFC penalties.

In a WIPS system, an electrically powered heater slat is positioned on a wing leading edge so that the heater mat melts ice on the leading edge. However, such a system is power hungry and uses high current and voltage wires to supply the electrical power. The WIPS system is expensive, time consuming to service, heavy, and requires electromagnetic compatibility (EMC) and electromagnetic interference (EMI) protection. Moreover, the power for the heater slats needs to be produced by the engine and the heat needs to be managed so it does not damage the aircraft structure. Thus fuel consumption is negatively impacted because of the increased weight and power requirements of the WIPS.

What is needed then, is an ice protection system that enabling increased fuel and operation efficiency. The present disclosure satisfies this need.

SUMMARY

Described herein is an ice protection system 200 for an aerodynamic surface 206 of an aircraft 202. The system comprises a reservoir 208; an electronics cooling system 210 connected to the reservoir 208 and comprising a first conduit 212; and a second conduit 232 in communication with the electronics cooling system 210. The electronics cooling system 210 distributes coolant 218 from the reservoir 208 through the first conduit 212 in thermal contact 220 with electronics 222 (e.g., motor controller), so that heat 224 is transferred from the electronics 222 to the coolant 218 (thereby cooling the electronics 222). In addition, a pump 214 operatively coupled/connected (e.g. at 216) to the reservoir 208 and the second conduit 232 pumps the coolant 218 onto the aerodynamic surface 206 so that the coolant 218 (e.g., ice-protection fluid) reduces or prevents ice formation 204 on the aerodynamic surface 206.

In one or more examples, a porous panel 238 on the aerodynamic surface 206 includes the outlet 232a and the coolant 218 leaks out of the porous panel 238 onto the aerodynamic surface 206. Locations for the porous panel 238 include, but are not limited to, on a slat, on a tail, on a wing 234, on a propeller 500, on a cockpit window 308, or an engine inlet 236.

In various examples, the coolant 218 (e.g., propylene glycol combined with a thinner) mixes with water on the aerodynamic surface 206 and suppresses a freezing point of the water (e.g., super cooled liquid droplets or water encountered in an icing envelope as defined in FAR 25 Appendix C or FAR 25 Appendix O).

A connector 310 connects the first conduit 212 to the second conduit 232. In one example, the connector 310 connects the first conduit 212 to the second conduit 232 downstream (e.g. at 318) of the electronics 222, so that the coolant 218 pumped to the aerodynamic surface 206 comprises at least a portion of the heat 224 transferred from the electronics 222.

In one or more embodiments, the first conduit 212 and the second conduit 232 comprise flex hoses or plastic tubing.

The ice protection system 200 may further include a fluid level sensor 312 connected to the reservoir 208. The fluid level sensor 312 measures the coolant 218 level in the reservoir 208 and sends an alert when the level of coolant 218 falls below a threshold level. Coolant 218 in the reservoir 208 may be replenished through the service port 314 connected to ground service equipment 316.

The capacity of the reservoirs is adapted to provide coolant for electronics cooling system and the ice protection. For example, a plurality of the reservoirs 208 may be used to store the coolant 218 and/or least one of reservoirs 208 may have a coolant 218 capacity of at least 20 gallons (about 75.7 litres).

The present disclosure further describes a method of manufacturing, refitting, or servicing an aircraft 202, comprising mounting an electronics cooling apparatus 210 distributing coolant 218 for cooling electronics 222 on an aircraft 202; mounting an ice protection apparatus 242 on the aircraft 202; and connecting the ice-protection apparatus to the electronics cooling apparatus 210. The ice-protection apparatus receives the coolant 218 from the electronics cooling apparatus 210 and distributes the coolant 218 onto an aerodynamic surface 206 outside of the aircraft 202, the coolant 218 reducing and removing ice formation 204 on the aerodynamic surface 206. The method comprises connecting the first conduit 212 to the reservoir 208 and thermally contacting the first conduit 212 to electronics 222 on the aircraft 202, so that heat 224 dissipates from the electronics 222 when the coolant 218 from the reservoir 208 flows through the first conduit 212 in thermal contact 220 with the electronics 222. The method further comprises connecting the second conduit 232 to the first conduit 212 or the reservoir 208 using a connector 310, so that the connector 310 diverts at least a portion of the coolant 218 to an outlet 232a on an aerodynamic surface 206 on the aircraft 202. In various examples, the connector 310 is positioned on the first conduit 212 downstream 318 of the electronics 222, such that the coolant 218 on the aerodynamic surface 206 comprises at least a portion of the heat 224.

In various examples, the method further comprises replenishing the coolant 218 in the reservoir 208 through a service port 314 connected to the reservoir 208; mounting a generator having lower power output, as compared to the generator on an otherwise identical aircraft 202 without the ice protection system 200; and mounting a turbofan engine 400 having a smaller fuel consumption, as compared to the turbofan engine 400 on an otherwise identical aircraft 202 without the ice protection system 200.

The present disclosure further describes a method of operating an aircraft 202, comprising providing an aircraft 202 with an ice protection system 200 as described herein; providing instructions allowing higher thrust for the aircraft 202 in icing conditions, as compared to an otherwise identical aircraft 202 without the ice protection system 200; and providing instructions allowing operation of the ice protection system 200 while the aircraft 202 is parked.

BRIEF DESCRIPTION OF THE DRAWINGS

Referring now to the drawings in which like reference numbers represent corresponding parts throughout.

DESCRIPTION

In the following description, reference is made to the accompanying drawings which form a part hereof, and which is shown, by way of illustration, several embodiments. It is understood that other embodiments may be utilized and structural changes may be made without departing from the scope of the present disclosure.

Technical Description

System Examples

Figure 2:
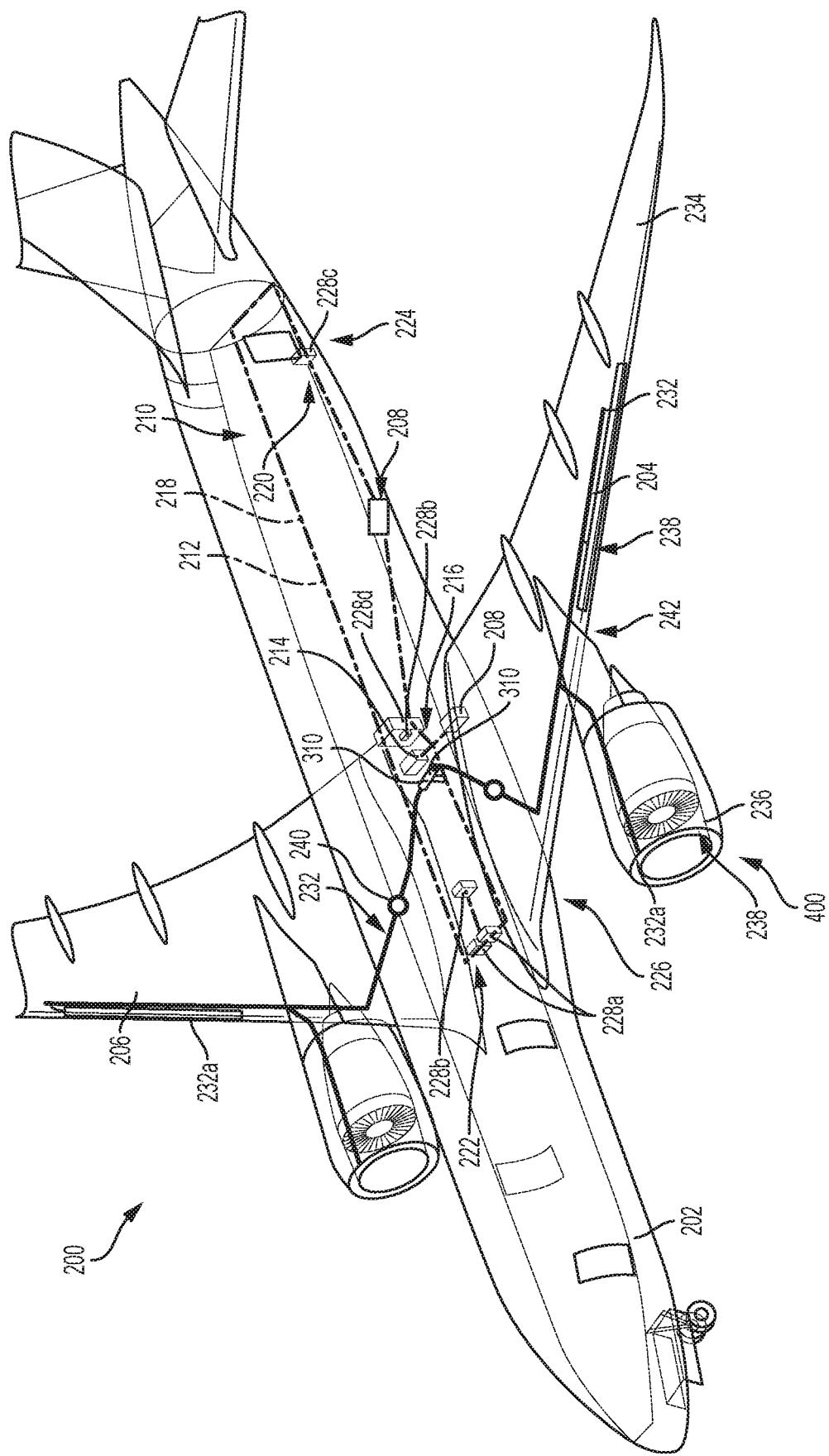
FIG. 2 illustrates an ice protection system according to one or more embodiments.

FIG. 2 illustrates an ice protection system 200 on an aircraft 202 for preventing or suppressing ice buildup 204 on one or more aerodynamic surfaces/airfoils 206 of the aircraft 202. The ice protection system 200 comprises one or more reservoirs 208 and ice protection distribution system combined with an electronics cooling system 210.

The electronics cooling system 210 includes one or more first conduits 212 (e.g., a plumbing system) connected to the one or more reservoirs 208, and one or more pumps 214 operatively coupled 216 to the one or more reservoirs 208. The electronics cooling system 210 distributes coolant 218 from the one or more reservoirs 208 through the one or more first conduits 212 in thermal contact 220 with electronics 222, so that heat 224 is transferred from the electronics 222 to the coolant 218. In various examples, the electronics cooling system 210 is a primary electronic cooling system (PECS), wherein the PECS comprises two pumps 214 (e.g., 36 Gallon per minute pumps) and a reservoir 208 (disposed in the aircraft's wheel well 226).

FIG. 2 further illustrates the electronics 222 comprising a first air conditioning unit or heat exchanger 228a, a direct current DC motor supplying electrical power to the aircraft electrical system, and a second back up heat exchanger at the rear of the aircraft 202. In one or more examples, the heat exchanger 228a includes four compressors and four motors, motor controllers 228b controlling the motors, an electric fan, and a radiator. Electronics 222 may also include heat loads 228c and 228d.

The ice protection system 200 further comprises one or more second conduits 232, or a system of conduits or distribution tubing, in communication with the one or more pumps 214 and/or the first conduit 212 and/or the one or more reservoirs 208. One or more of the pumps 214 pumps the liquid coolant 218 through the one or more second conduits 232 to one or more outlets 232a disposed on one or more aerodynamic surfaces 206 located on the aircraft's wing(s) 234 and engine inlet(s) 236. In various examples, one or more porous panels 238 (connected to the one or more second conduits 232 and including one or more of the outlets 232a) are disposed on the one or more aerodynamic surfaces 206 so that the coolant 218 flows, leaks, or weeps onto the one or more aerodynamic surfaces 206 from the one or more porous panels 238. Also illustrated in FIG. 2 is hydraulic leak isolation devices 240.

Figure 3:
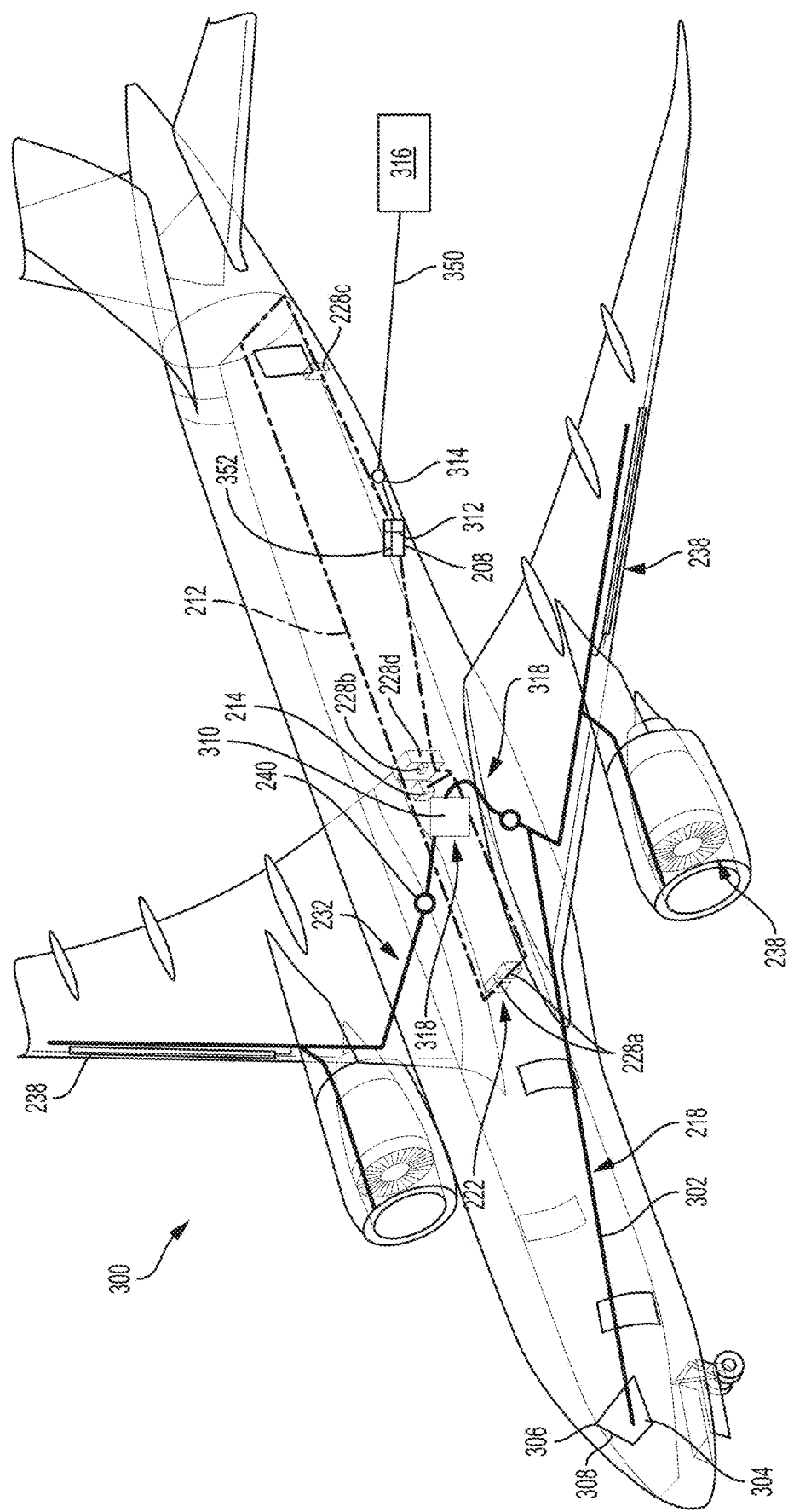
FIG. 3 illustrates an ice protection system distributing coolant to a cockpit window, according to one or more embodiments.

FIG. 3 illustrates a system 300 example wherein a second conduit 302 is connected to a porous panel 304 on the aerodynamic surface 306 of a cockpit window 308 on the aircraft 202 providing ice protection window fluid 218 (e.g., for SLD, i.e. super cooled large droplet encounters).

Further Example of a Porous Panel on an Engine Inlet

Figure 4:
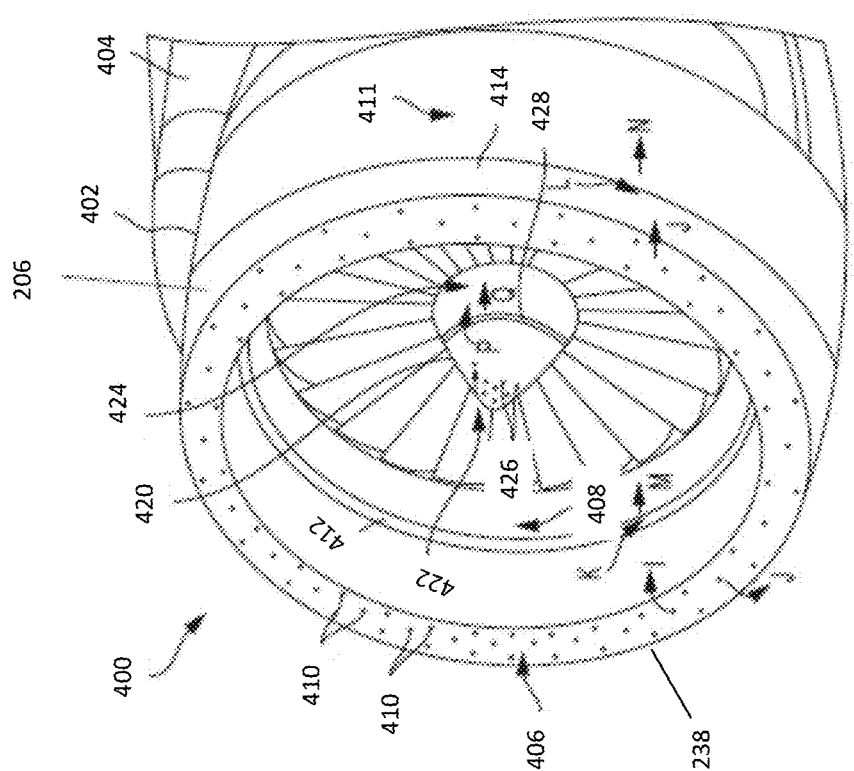
FIG. 4 illustrates a porous panel on an engine inlet, according to one or more embodiments.

FIG. 4 illustrates using the ice protection system according to various aspects on a gas turbine engine 400. The gas turbine engine includes a nacelle 402 mounted on a pylon 404. The pylon 404 could connect the nacelle 402 to a wing or fuselage of an aircraft, for example. The nacelle 402 includes a leading edge or lipskin 406. The leading edge or lipskin 406 includes the porous panel 238 including a plurality of orifices or outlets 410, through which the coolant comprising ice protection fluid can weep out. The ice protection fluid weeping out of the orifices 410 can travel in the direction of arrow I toward an inward-facing downstream surface 408 of the nacelle 402 or in the direction of arrow J toward an outward-facing downstream surface 411 of the nacelle 402. The inward-facing downstream surface 408 of the nacelle 402 includes an aperture 412. The aperture 412 could be arranged as a continuous aperture or as a series of spaced-apart apertures. Ice protection fluid traveling toward the aperture 412 can be drawn into the aperture 412 in the direction of arrow K and water carried by the ice protection fluid can continue into the engine 400 in the direction of arrow M. The outward-facing downstream surface 411 of the nacelle 402 includes an aperture 414. The aperture 414 could be arranged as a continuous aperture or as a series of spaced-apart apertures. Ice protection fluid traveling toward the aperture 414 can be drawn into the aperture 414 in the direction of arrow L and water carried by the ice protection fluid can continue aft in the direction of arrow N.

A spinner 420 for the gas turbine engine 400 can also include a porous panel. An array of orifices 426 for weeping the ice protection fluid onto the spinner, can be arranged on a first region 422 (e.g., an upstream region) of the spinner 420. An aperture 428 can be arranged on a second region 424 (e.g., a downstream region) of the spinner 420. The aperture 428 could be arranged as a continuous aperture or as a series of spaced-apart apertures. Ice protection fluid traveling from the orifices 426 (in the direction of arrow O) toward the aperture 428 can be drawn into the aperture 428 in the direction of arrow P and water carried by the ice protection fluid can continue into the engine 400 in the direction of arrow Q.

In one or more examples, the engines 400 used with the ice protection system are smaller and more efficient, thereby enabling more efficient and lighter aircraft. One or more examples of the ice protection system enable the use of engines 400 with very high bypass ratios and small cores because anti-ice bleed flow is reduced or eliminated.

Example of a Porous Panel on a Propeller or Jet Engine Fan

Figure 5:
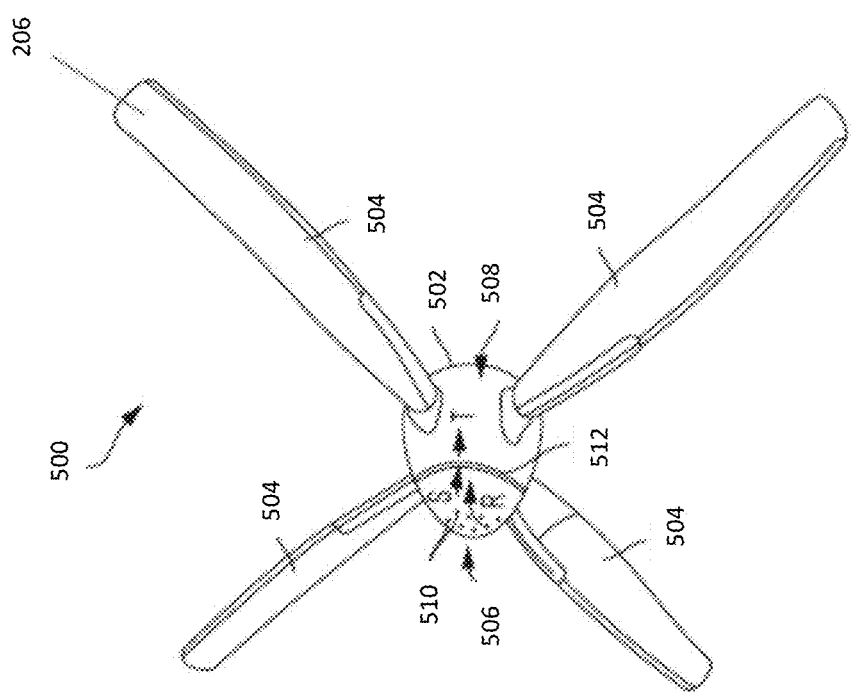
FIG. 5 illustrates a porous panel on a propeller, according to one or more embodiments.

FIG. 5 illustrates the ice protection system according to various aspects combined with an aircraft propeller 500. The propeller includes four propeller blades 504 extending from a spinner 502. An array of orifices 510, can be arranged on a first region 506 (e.g., an upstream region) of the spinner 502. An aperture 512, similar to aperture 412 or aperture 428 shown in FIG. 4, can be arranged on a second region 508 (e.g., a downstream region) of the spinner 502. The aperture 512 could be arranged as a continuous aperture or as a series of spaced-apart apertures. Ice protection fluid traveling from the orifices 510 (in the direction of arrow R) toward the aperture 512 can be drawn into the aperture 512 in the direction of arrow S and water carried by the ice protection fluid can continue toward the blades 504 in the direction of arrow T.

In various examples, geared turbofan engines 400 have fans that don't spin very fast. At some point they may spin slow enough that ice can form near the hub of the blade and an anti-ice system can be used to remove ice from the hub.

Process Steps

Fabrication

Figure 6:
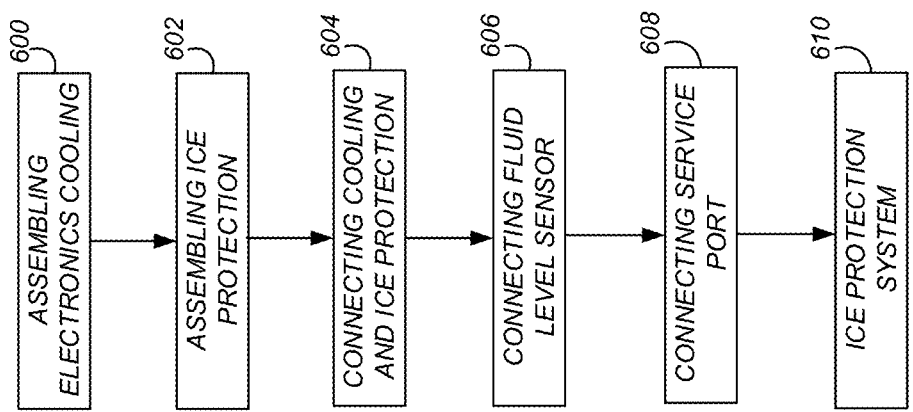
FIG. 6 is a flowchart illustrating a method of fabricating an ice protection system, according to one or more embodiments.

FIG. 6 is a flowchart illustrating a method of fabricating an ice-protection apparatus (e.g., a fluid ice protection system (FIPS))

Marking also reference to FIG. 2 and FIG. 3, block 600 represents obtaining or assembling an electronics cooling apparatus 210. In one or more embodiments, the electronics cooling apparatus 210 comprises a reservoir 208 or tank storing coolant; and a first conduit 212 connected to the reservoir 208, wherein heat 224 dissipates from the electronics 222 when the coolant from the reservoir 208 flows through the first conduit 212 in thermal contact 220 with the electronics 222. The reservoir 208 has increased capacity (e.g., at least 20 gallons, i.e. about 75.7 litres) as compared to a conventional electronics cooling system reservoir/tank that is not used with an ice-protection apparatus.

Example electronics/electrical systems cooled by the electronics cooling system 210 include, but are not limited to, a motor providing power to an air conditioning system or a liquid cooled galley on the aircraft 202.

Block 602 represents obtaining or assembling an ice-protection distribution system 242 comprising one or more second conduits 232 including one or more outlets 232a that may be disposed on one or more aerodynamic surfaces 206 located on an outside of the aircraft 202. In various examples, the distribution system 242 further comprises one or more porous panels 238 connected to the one or more second conduits 232 and including one or more of the outlets 232a, so that the coolant 218 flows, weeps, or leaks onto the one or more aerodynamic surfaces 206 from the one or more porous panels 238. Exemplary locations for the aerodynamic surface 206 include, but are not limited to, on a slat, a propeller, a cockpit window, or an engine inlet on the aircraft 202.

In various examples, the first and second conduits 212, 232 comprise flex hoses, plastic or nylon tubing, or ducting. In various examples, liquid coolant 218 is pumped form the tank 208 to the porous panels 238 through second conduits 232 comprising branching system of nylon tubing.

Block 604 represents connecting (e.g., using connectors 310) the ice-protection distribution system 242 to the electronics cooling apparatus 210, so that the ice-protection distribution system 242 receives the coolant 218 from the electronics cooling apparatus 210 and distributes the coolant 218 onto an aerodynamic surface 206 of the aircraft 202 through the porous panel 238.

Block 606 represents connecting a coolant fluid monitoring/level sensor 312 measuring the coolant level in one or more of the reservoirs.

Block 608 represents connecting a service port 314 to the reservoir 208, wherein coolant 218 in the reservoir 208 is replenished through the service port 314 when the service port 314 is connected with connection 350 to ground service equipment 316.

Block 610 illustrates the end result, an ice protection system 200 including electronics cooling apparatus 210 distributing coolant 218 for cooling electronics 222; and an ice protection apparatus 242 connected to the electronics cooling apparatus 210, wherein the ice-protection apparatus receives the coolant 218 from the electronics cooling apparatus 210 and distributes the coolant 218 onto an aerodynamic surface 206 of the aircraft 202, the coolant 218 reducing and removing ice formation 204 on the aerodynamic surface 206.

In one or more embodiments, one or more connectors 310 connect the one or more second conduits 232 to the electronics cooling apparatus 210 downstream 318 of the electronics 222 so that the ice-protection fluid 218 distributed to the aerodynamic surface 206 comprises at least a portion of the heat 224 and reduces or prevents ice build-up 204 on the aerodynamic surface 206. The heat 224 helps reduce the viscosity (increase spreading) of the coolant 218, thereby improving its performance as an ice protection fluid.

Example pumps include, but are not limited to, Direct Current (DC) motor driven pumps. In one example, the pumps 214 extract fluid from an unpressurized reservoir 208 and boost the pressure to at least approximately 100 psia (i.e. about 689 MPa).

In one or more embodiments, the coolant is an ice-protection fluid comprising a freezing point suppressant, including but not limited to, antifreeze, glycol based fluid such as propylene glycol, and a thinner (e.g. water). The thinner reduces viscosity of the coolant as compared to the coolant in an electronics cooling system 210 that is not connected to the ice protection apparatus. Thereby, the coolant performs at least two functions (1) heat 224 dissipates from the electronics 222 when the coolant 218 flows through a portion of the electronics cooling apparatus 210 in thermal contact 220 with the electronics 222; and (2) the coolant 218 mixes with water droplets on the aerodynamic surfaces 206, lowering the freezing point of the water droplets so that the water droplets cannot freeze. The mixture of glycol-based fluid and water droplets then flow off the aircraft 202 together.

The ice protection system can be mounted on a vehicle such as an aircraft 202 or high speed train so as to reduce ice buildup on the vehicle's aerodynamic surfaces (e.g., the train cockpit windows or the leading edge of an airfoil, an engine nacelle, and/or a spinner for a propeller or fan).

Aircraft Fabrication, Refitting, and Servicing

Figure 7:
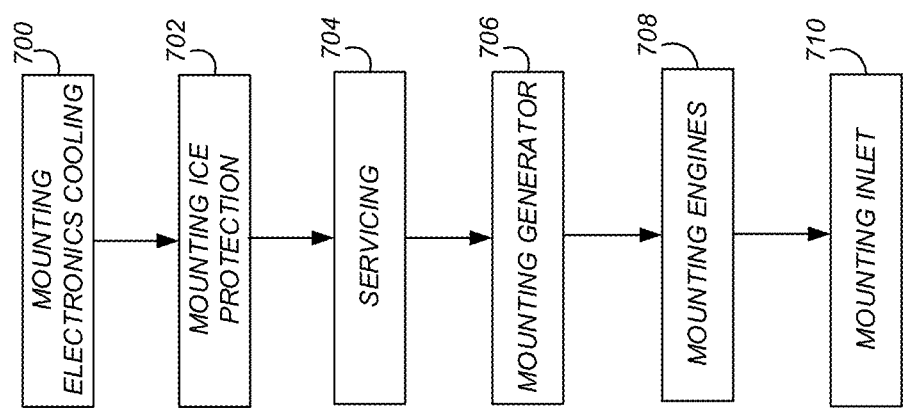
FIG. 7 is a flowchart illustrating a method of fabricating, refitting, or servicing an aircraft, according to one or more embodiments.

FIG. 7 illustrates a method of manufacturing, refitting, or servicing an aircraft 202 including, but not limited to, commercial and military aircraft. The ice protection system 200 is particularly valuable on large aircraft carrying >100 passengers and having a large number of electric systems (including, e.g., a large liquid cooled galley system).

Block 700 represents optionally mounting an electronics cooling apparatus 210 distributing coolant for cooling electronics 222 on an aircraft 202. The electronics cooling apparatus 210 comprises a reservoir 208 and a first conduit 212 and the step comprises connecting the first conduit 212 to the reservoir 208 and thermally contacting the first conduit 212 to electronics 222 on the aircraft 202, so that heat 224 dissipates from the electronics 222 into the coolant when the coolant from the reservoir 208 flows through the first conduit 212 in thermal contact 220 with the electronics 222.

Block 702 represents optionally mounting an ice protection apparatus 242 on the aircraft 202 and connecting the ice-protection apparatus to the electronics cooling apparatus 210, such that the ice-protection apparatus receives the coolant 218 from the electronics cooling apparatus 210 and distributes the coolant 218 onto an aerodynamic surface 206 on outside surface of the aircraft 202. The coolant 218 reduces and removes/prevents ice formation 204 on the aerodynamic surface 206. The ice-protection apparatus 242 further comprises a second conduit 232, and the step comprises connecting the second conduit 232 to the first conduit 212 or the reservoir 208 using a connector 310, such that the connector 310 diverts at least a portion of the coolant 218 to the one or more second conduits 232 distributing the portion of the coolant 218 to an outlet 232a/porous panel or membrane 238 on an aerodynamic surface 206 on the aircraft 202.

Figure 1:
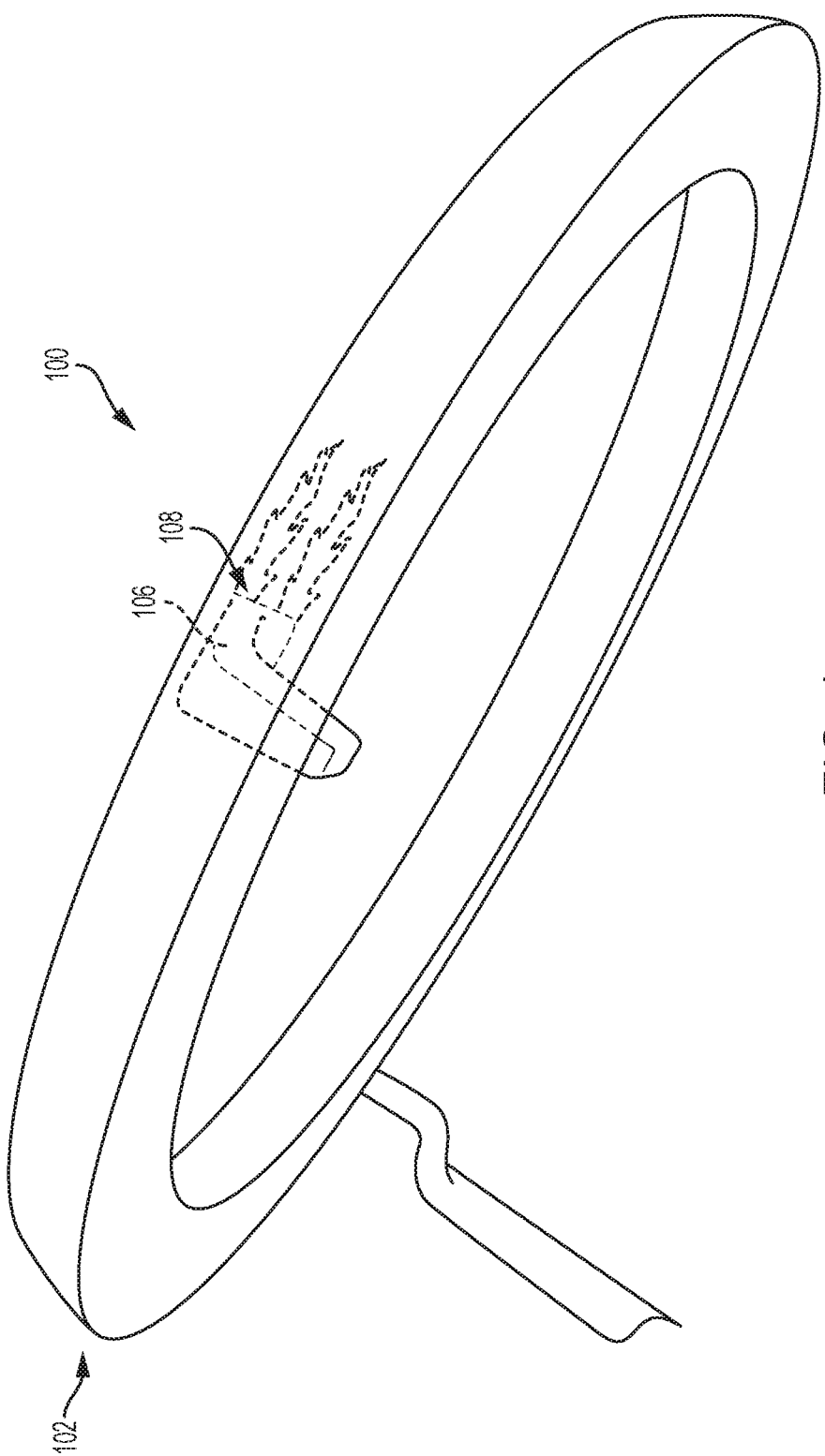
FIG. 1 illustrates a conventional engine bleed air de-icing system 100 on an engine inlet 102.

The ice-protection system 242/200 is mounted on the aircraft 202 and certified during fabrication or refitting, e.g., when the aircraft 202 is re-engined. If present, the electric wing ice protection system (WIPS) is removed and replaced with the ice protection system 200. The WIPS controller, heavy high current wires, translating wire bundle, and heated slats in the WIPS system are replaced with the first and second conduits 232, 212 (e.g., light weight ~½ inch-about 1.27 cm—plastic tubing), reservoir(s) 208, and porous panels 238, as described herein. In another example, the pneumatic engine anti-ice system (EAI) (e.g., as illustrated in FIG. 1) is removed and replaced with the FIPS. In yet a further example, a back up anti-ice system comprising heated windows is included on the aircraft 202 for SLD encounters.

Block 704 represents optionally servicing the electronic cooling system 210 and/or ice protection system 200 (e.g., coolant 218 service). Servicing may be required more frequently when the aircraft 202 encounters icing conditions. The step optionally comprises replenishing or filling the coolant 218 in the reservoir 208 through a service port 314 connected to the reservoir 208 and using ground service equipment 316. WIPS service can be replaced by plumbing and porous panel 238 service.

Block 706 represents optionally mounting generator(s) having lower power output as compared to generator(s) on an otherwise identical aircraft 202 without the ice protection system 200. In one or more examples, the old higher power output generator(s) are removed. The generators mounted on the aircraft with the ice protection system 200 may be smaller with lower power output because the power requirements of one or more of the ice protection systems 200 described herein are substantially lower as compared to the power requirements of aircraft 202 using the WIPS or EAI systems.

Block 708 represents optionally mounting or refitting the engine(s) on the aircraft 202, wherein the engine 400 (e.g., turbofan engine) has a smaller fuel consumption, as compared to the engine (e.g., turbofan engine) on an otherwise identical aircraft 202 without the ice protection system 200. The engines can be resized (i.e., be smaller with lower power output) because of the substantially reduced power requirements of one or more of the ice protection systems 200 described herein, as compared to the power requirements of aircraft 202 using the WIPS or EAI systems. WIPS systems can require alot of power. Power requirements of example ice protections systems 200 disclosed herein can be significantly lower (e.g., more than 95% lower than WIPS).

Block 710 represents mounting a smaller, more light weight engine inlet (e.g., including a higher composite material content), as compared to an otherwise identical aircraft 202 without the FIPS system (e.g., as compared to an aircraft 202 using WIPS or EAI for anti-icing).

Thus, in some examples, the ice protection system 200 dramatically decreases engine power demand and allows the engine, inlet, and generators to be dramatically resized, thereby improving aircraft mission performance.

Operation

Figure 8:
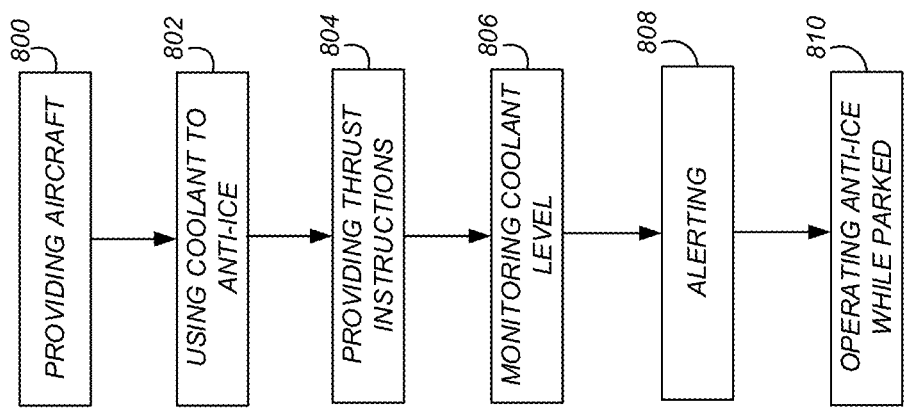
FIG. 8 is a flowchart illustrating a method of operating an aircraft, according to one or more embodiments.

FIG. 8 is a flowchart illustrating a method of operating the ice protection system 200 and/or aircraft 202 disclosed herein.

Block 800 represents providing an aircraft 202 including an ice protection system 200, the ice protection system 200 comprising a reservoir 208; an electronics cooling system 210 connected to the reservoir 208 and comprising a first conduit 212; a pump 214 operatively coupled 216 to the reservoir 208; and a second conduit 232 in communication with the pump 214 and including an outlet 232a disposed at the aerodynamic surface 206 located on an outside surface of the aircraft 202. The electronics cooling system 210 distributes coolant 218 from the reservoir 208 through the first conduit 212 in thermal contact 220 with electronics 222, so that heat 224 is transferred from the electronics 222 to the coolant 218.

Block 802 represents using the coolant 218 fluid to anti-ice the aerodynamic surfaces 206 of the wing during normal and super cooled large droplet (SLD) icing conditions. The pump 214 pumps the coolant 218 onto the aerodynamic surface 206 so that the coolant 218 reduces or prevents ice formation 204 on the aerodynamic surface 206 (e.g., the coolant 218 mixes with water on the aerodynamic surface 206 and suppresses a freezing point of the water). In one or more embodiments, the coolant 218 fluid is used under icing conditions/envelopes as defined in 14 CFR Part 24 Appendix C or Appendix O (FAR 24 Appendix C or FAR 24 Appendix O).

Block 804 represents optionally providing instructions allowing higher engine thrust for the aircraft 202 in icing conditions (e.g., during landing/descending), as compared to an otherwise identical aircraft 202 without the ice protection system 200.

Block 806 represents monitoring the coolant 218 level using a fluid level sensor 312 so that the coolant 218 can be refilled after icing encounters, as needed. In one or more embodiments, the fluid level sensor 312 sends an alert to flight, ground, or maintenance crew when the level of coolant 218 falls below a threshold level.

Block 808 represents alerting the crew when icing conditions need to be avoided (e.g., due to low coolant 218 levels or other failures of the ice protection system 200.

Block 810 represents optionally providing instructions allowing operation of the ice protection system 200 while the aircraft 202 is parked (even under hot ground climate conditions). The WIPS system, on the other hand, cannot be operated on the ground while the aircraft is parked because the heated slats could damage the aircraft structure (WIPS systems need airflow during operation).

Processing Environment

Figure 9:
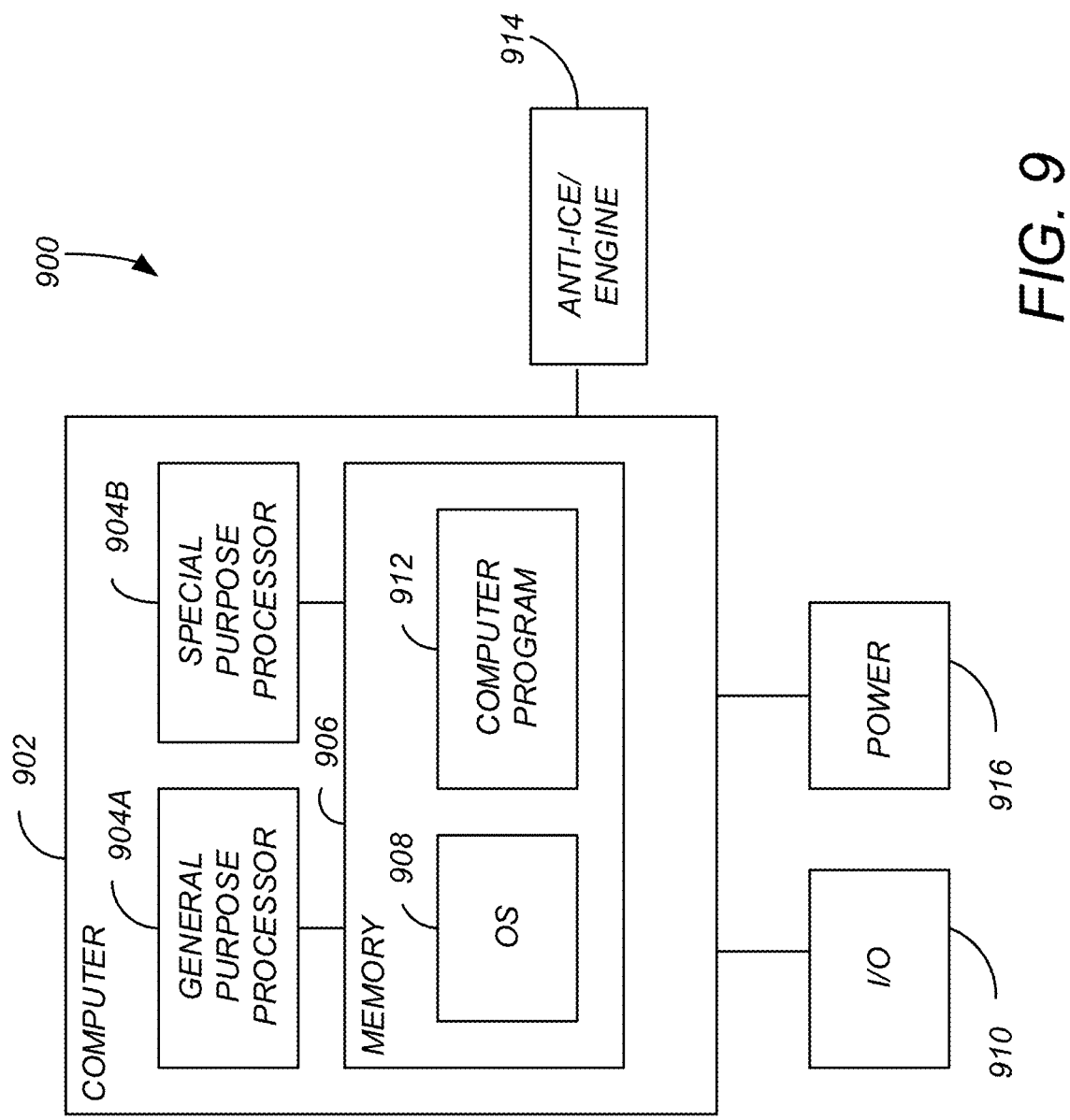
FIG. 9 is an example computer hardware environment for controlling the manufacturing processes described herein.

FIG. 9 illustrates an exemplary system 900 used to implement processing elements needed to control the ice protection system, engine thrust (e.g. block 914), or other processes described herein.

The computer 902 comprises a processor 904 (general purpose processor 904A and special purpose processor 904B) and a memory, such as random access memory (RAM) 906. Generally, the computer 902 operates under control of an operating system 908 stored in the memory 906, and interfaces with the user/other computers to accept inputs and commands (e.g., analog or digital signals) and to present results through an input/output (I/O) module 910. The computer is connected to an electric power unit 916. The computer program application 912 accesses and manipulates data stored in the memory 906 of the computer 902. The operating system 908 and the computer program 912 are comprised of instructions which, when read and executed by the computer 902, cause the computer 902 to perform the operations herein described. In one embodiment, instructions implementing the operating system 908 and the computer program 912 are tangibly embodied in the memory 906, thereby making one or more computer program products or articles of manufacture capable of controlling the ice protection system 200, 914 and engine thrust according to the methods described herein. In one or more embodiments, a computer connected to the fluid level sensor 312 sends an alert to flight, ground, or maintenance crew when the level of coolant 218 falls below a threshold level.

As such, the terms "article of manufacture," "program storage device" and "computer program product" as used herein are intended to encompass a computer program accessible from any computer readable device or media.

Those skilled in the art will recognize that many modifications may be made to this configuration without departing from the scope of the present disclosure. For example, those skilled in the art will recognize that any combination of the above components, or any number of different components, peripherals, and other devices, may be used.

CONCLUSION

This concludes the description of the preferred embodiments of the present disclosure. The foregoing description of the preferred embodiment has been presented for the purposes of illustration and description. It is not intended to be exhaustive or to limit the disclosure to the precise form disclosed. Many modifications and variations are possible in light of the above teaching. It is intended that the scope of rights be limited not by this detailed description, but rather by the claims appended hereto.

What is claimed is:

1. An ice protection system for an aerodynamic surface of an aircraft, the ice protection system comprising:
 a reservoir;
 an electronics cooling system connected to the reservoir and comprising a first conduit, wherein:
  the electronics cooling system distributes coolant from the reservoir through the first conduit in thermal contact with electronics, whereby
  heat is transferred from the electronics to the coolant;
 a pump operatively coupled to the reservoir; and
 a second conduit in communication with the pump and including an outlet disposed at the aerodynamic surface located on an outside of the aircraft, wherein the pump pumps the coolant onto the aerodynamic surface and the coolant reduces or prevents ice formation on the aerodynamic surface.

2. The ice protection system of claim 1, further comprising a porous panel on the aerodynamic surface and including the outlet, wherein the coolant leaks out of the porous panel onto the aerodynamic surface.

3. The ice protection system of claim 2, wherein the porous panel is attached to a slat, a wing, a propeller, a cockpit window, or an engine inlet.

4. The ice protection system of claim 1, wherein the electronics comprises an air conditioning unit and the coolant mixes with water on the aerodynamic surface and suppresses a freezing point of the water.

5. The ice protection system of claim 4, wherein the water comprises super cooled liquid droplets.

6. The ice protection system of claim 4, wherein the water comprises the water encountered in an icing envelope as defined in FAR 24 Appendix C or FAR 24 Appendix O.

7. The ice protection system of claim 1, wherein the electronics comprises an air conditioning unit and the coolant includes an ice-protection fluid comprising propylene glycol and a thinner.

8. The ice protection system of claim 1, further comprising a connector connecting the first conduit to the second conduit downstream of the electronics, wherein the coolant pumped to the aerodynamic surface comprises at least a portion of the heat transferred from the electronics including an air conditioning unit.

9. The ice protection system of claim 1, wherein the first conduit and the second conduit comprise flex hoses or plastic tubing.

10. The ice protection system of claim 1, further comprising a plurality of reservoirs storing the coolant, wherein at least one of reservoirs has a coolant capacity of least 20 gallons (about 75.7 liters) to replenish the coolant pumped onto the aerodynamic surface.

11. The ice protection system of claim 1, further including a fluid level sensor connected to the reservoir, the fluid level sensor measuring the coolant level in the reservoir and sending an alert when the coolant level of the coolant falls below a threshold level due to pumping of the coolant onto the aerodynamic surface.

12. The ice protection system of claim 1, further comprising a service port for connection to ground service equipment, wherein the coolant in the reservoir is replenished through the service port.

13. The ice protection system of claim 1, wherein:
the electronics comprises a motor controller controlling a radiator or an air conditioning unit, or the motor controller and the air conditioning unit, and
the coolant distributed to the aerodynamic surface comprises at least a portion of the heat transferred from the air conditioning unit, the motor controller, or the motor controller and the air conditioning unit.

14. An aircraft 202 comprising the ice protection system of claim 1.

15. A method of manufacturing, refitting, or servicing an aircraft, comprising:
mounting an electronics cooling apparatus distributing coolant for cooling electronics comprising an air conditioning unit on an aircraft; and
mounting an ice protection apparatus on the aircraft and connecting the ice protection apparatus to the electronics cooling apparatus, wherein the ice protection apparatus receives the coolant from the electronics cooling apparatus and distributes the coolant onto the aerodynamic surface outside of the aircraft, the coolant reducing and removing ice formation on the aerodynamic surface of the aircraft, wherein the coolant distributed to the aerodynamic surface comprises at least a portion of heat transferred from the air conditioning unit.

16. The method of claim 15, wherein the electronics cooling apparatus comprises a reservoir and a first conduit and the ice-protection apparatus further comprises a second conduit, the method further comprising:
connecting the first conduit to the reservoir and thermally contacting the first conduit to the electronics on the aircraft, wherein the heat dissipates from the electronics when the coolant from the reservoir flows through the first conduit in thermal contact with the electronics; and
connecting the second conduit to the first conduit or the reservoir using a connector, wherein the connector diverts at least a portion of the coolant to the second conduit distributing the portion of the coolant to an outlet on the aerodynamic surface.

17. The method of claim 16, further comprising:
positioning the connector on the first conduit downstream of the electronics, such that the coolant on the aerodynamic surface comprises the at least a portion of the heat transferred from the electronic including the air conditioning unit.

18. The method of claim 15, wherein the ice-protection apparatus includes a porous panel and the coolant flows from the porous panel onto the aerodynamic surface on a tail or wing of the aircraft.

19. The method of claim 15, further comprising
replenishing the coolant in a reservoir through a service port connected to the reservoir;
mounting a generator having lower power output, as compared to the generator on the aircraft without the ice protection apparatus; and
mounting a turbofan engine having a smaller fuel consumption, as compared to the turbofan engine on the aircraft without the ice protection apparatus.

20. A method of operating an aircraft, comprising:
providing an aircraft comprising an ice protection system, the ice protection system comprising
a reservoir;
an electronics cooling system connected to the reservoir and comprising a first conduit, wherein:
the electronics cooling system distributes coolant from the reservoir through the first conduit in thermal contact with electronics, whereby
heat is transferred from the electronics to the coolant;
a pump operatively coupled to the reservoir; and
a second conduit in communication with the pump and including an outlet disposed at an aerodynamic surface located on an outside of the aircraft, wherein the pump pumps the coolant onto the aerodynamic surface and the coolant reduces or prevents ice formation on the aerodynamic surface;
providing instructions allowing higher thrust for the aircraft in icing conditions, as compared to the aircraft without the ice protection system; and
providing instructions allowing an operation of the ice protection system while the aircraft is parked.

* * * * *